United States Patent

Duke

[19]

[11] Patent Number: 5,979,042
[45] Date of Patent: Nov. 9, 1999

[54] PRINTED WIRING ASSEMBLY REWORK TOOL

[75] Inventor: Alan Moss Duke, Ferrisburgh, Vt.

[73] Assignee: Simmonds Precision Products, Inc., Richfield, Ohio

[21] Appl. No.: 08/814,959

[22] Filed: Mar. 10, 1997

Related U.S. Application Data

[60] Provisional application No. 60/013,355, Mar. 13, 1996.

[51] Int. Cl.$^6$ ..................................................... B23P 19/60
[52] U.S. Cl. ..................... 29/739; 408/203.5; 408/204; 408/703
[58] Field of Search ................. 29/843, 739; 408/203.5, 408/204, 202, 703, 72 B

[56] References Cited

U.S. PATENT DOCUMENTS

| | | | |
|---|---|---|---|
| 4,307,983 | 12/1981 | Blough et al. | 408/72 B |
| 4,940,370 | 7/1990 | Gipson | 408/203.5 X |

FOREIGN PATENT DOCUMENTS 1218835  1/1971  United Kingdom .

*Primary Examiner*—Carl J. Arbes
*Attorney, Agent, or Firm*—William E. Zitelli; Mark D. Saralino

[57] ABSTRACT

A printed wiring assembly rework tool and method which eliminates the need to remove a component from the printed wiring assembly in order to isolate a component pin from one or more printed circuits in the printed wiring assembly. The rework tool is able to mill or cut away a plated through hole and/or the area of the printed wiring assembly immediately surrounding the component pin without removing the component. Using the rework tool, the operation continues until the rework tool has either cut to a sufficient depth in the printed wiring assembly to sever a particular electrical connection, or the tool has cut all the way through the printed wiring assembly in order to completely isolate the component pin. The rework tool includes a pilot hole which accommodates the component pin as the tool cuts into the printed wiring assembly.

13 Claims, 3 Drawing Sheets

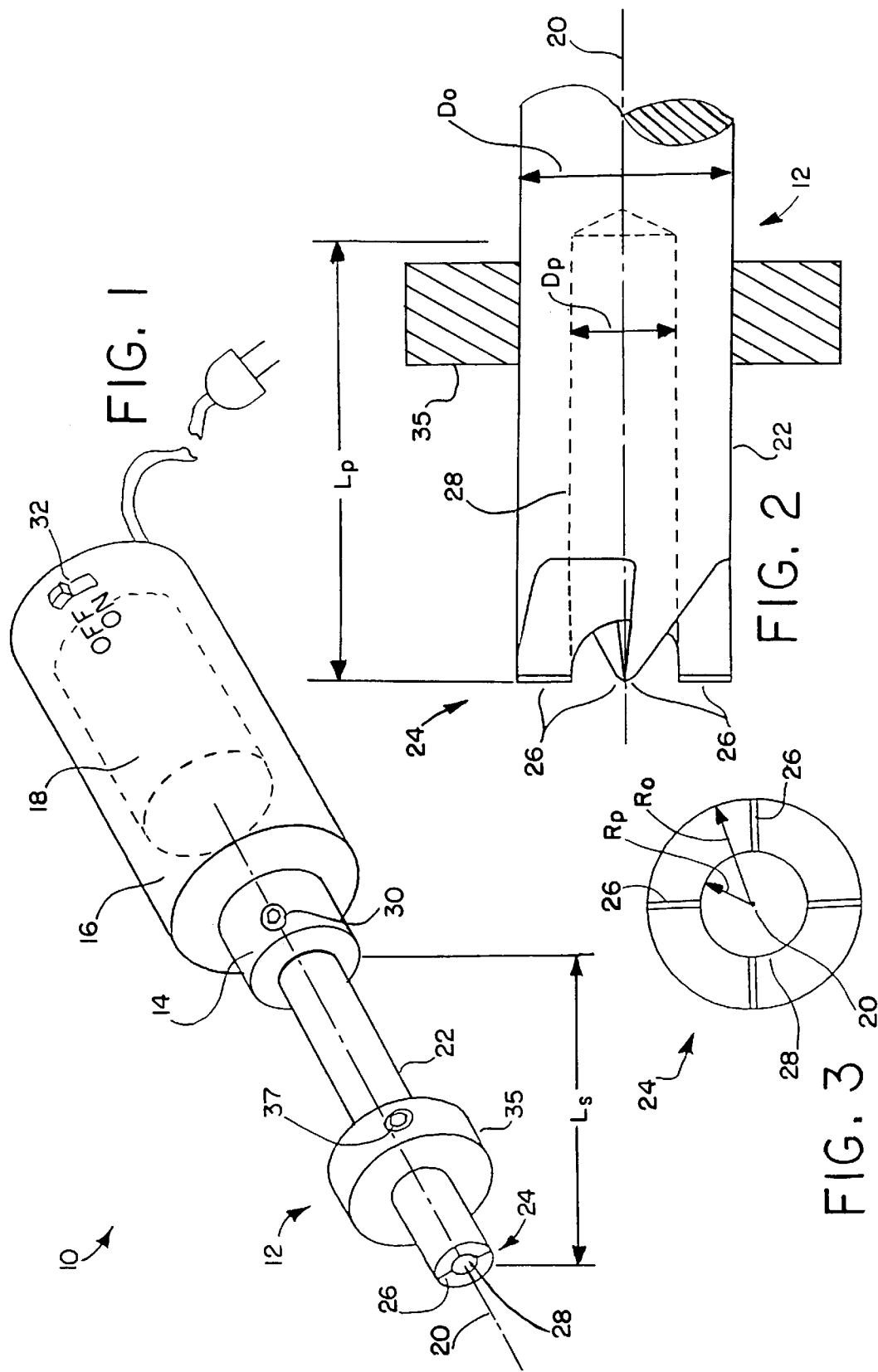

PRINTED WIRING ASSEMBLY REWORK TOOL

CROSS-REFERENCE TO RELATED APPLICATION

This patent claims priority to provisional patent application Ser. No. 60/013,355 filed on Mar. 13, 1996.

TECHNICAL FIELD

The present invention relates generally to a printed wiring assembly rework tool and method as is indicated. More particularly, the invention relates to a rework tool for modifying electrical connections without having to remove a component from a printed wiring assembly.

BACKGROUND OF THE INVENTION

Most electronic systems today include one or more electronic circuits assembled on printed wiring boards (also referred to as printed circuit boards). The printed wiring boards typically include a number of through holes for receiving leads or pins from various components which are mounted on the printed wiring board. These component pins extend through the holes and engage printed circuitry within the printed wiring boards which provide numerous electrical connections between the pins of the various components. After being physically mounted on the printed wiring boards, the component pins are typically soldered in the corresponding through holes to provide a reliable electrical connection between the pins and the associated printed circuitry. A printed wiring board on which the components are thus mounted is generally referred to as a printed wiring assembly. It is common during the development of electronic systems that design changes, layout errors, etc. may occur with respect to the printed wiring assemblies. As a result, it is oftentimes necessary to rework or modify printed wiring assemblies even after the components have been assembled and the component pins soldered. Such modifications include cuts, jumpers and so on to change the electrical connections among the component pins within the printed wiring assembly. Unfortunately, such modifications can be difficult to perform particularly when the goal is to isolate electrically one of the component pins from the printed wiring assembly and the printed wiring assembly is populated with high pin count parts such as daughter card connectors or pin grid arrays having on the order of 100 to 300 pins. Further complicating matters is the fact that when the printed wiring assembly utilizes a multi-layer wiring board, most of the printed circuitry is buried within the board. Consequently, it becomes even more difficult to isolate selectively one or more component pins from the printed circuitry.

Previously, reworking a printed wiring assembly to isolate one or more component pins involved removing the solder from each of the component pins in a given component in order to be able to remove the component from the printed wiring assembly. Then it was necessary to drill out the holes of any pins which were to be isolated using an oversize drill. Thereafter, the component needed to be remounted on the printed wiring assembly and all the pins had to be resoldered with the exception of those which were isolated. Unfortunately, this previous reworking technique was very labor intensive. The removal of high pin count components was particularly difficult, risky and time consuming. As an example, the removal of components was risky in that the printed wiring assembly and/or the component itself could be damaged. For instance, lifted pads, cracked plated through hole barrels, and broken component pins could result.

In view of the aforementioned shortcomings associated with previous techniques for reworking printed wiring assemblies, there is a strong need in the art for a rework tool and method for isolating a component pin from the printed wiring assembly in a timely and cost effective manner. In particular, there is a strong need for a rework tool and method which does not require that a component be removed initially from the printed wiring assembly, thereby avoiding the risks of lifted pads, cracked plated through hole barrels, etc.

SUMMARY OF THE INVENTION

A printed wiring assembly rework tool and method is provided which eliminates the need to remove a component from the printed wiring assembly in order to isolate a component pin from one or more printed circuits in the printed wiring assembly. The rework tool is able to mill or cut away a plated through hole and/or the area of the printed wiring assembly immediately surrounding the component pin without removing the component. Using the rework tool, the milling operation continues until the rework tool has either cut to a sufficient depth in the printed wiring assembly to sever a particular electrical connection, or the tool has cut all the way through the printed wiring assembly in order to completely isolate the component pin. The rework tool includes a pilot hole which accommodates the component pin as the tool cuts into the printed wiring assembly.

By not requiring that the component be removed from the printed wiring assembly, the present invention allows the printed wiring assembly to be reworked without the risk of damaging the component or the printed wiring assembly. Reworking of the printed wiring assembly can be performed in less time and at lower cost as compared to other techniques. Moreover, the present invention makes reworking much simpler. It is easier to rework assemblies so as to reduce the number of assemblies which ultimately have to be scrapped.

According to one particular aspect of the invention, a tool is provided for reworking a printed wiring assembly having a pin protruding through a printed wiring board. The tool includes a shank rotatable about an axis, a pilot hole in an end face of the shank and centered about the axis for receiving the pin, and cutting teeth on the end face of the shank for milling an annular slot around the pin in the printed wiring board as the shank is rotated about the axis and the pin is received by the pilot hole.

In accordance with another aspect of the invention, a tool apparatus is provided for reworking a printed wiring assembly having a pin protruding through a printed wiring board. The tool apparatus includes a shank rotatable about an axis, means for rotating the shank, a pilot hole in an end face of the shank and centered about the axis for receiving the pin, and cutting teeth on the end face of the shank for milling an annular slot around the pin in the printed wiring board as the shank is rotated about the axis and the pin is received by the pilot hole.

According to yet another aspect of the invention, a method is provided for reworking a printed wiring assembly having a pin protruding through a printed wiring board. The method includes the step of milling an annular slot around the pin in the printed wiring board.

To the accomplishment of the foregoing and related ends, the invention, then, comprises the features hereinafter fully described and particularly pointed out in the claims. The following description and the annexed drawings set forth in detail certain illustrative embodiments of the invention.

These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a perspective view of a printed wiring assembly rework tool apparatus in accordance with the present invention;

FIG. 2 is a partial plan view of a printed wiring assembly rework tool in accordance with the present invention;

FIG. 3 is an end view of the printed wiring assembly rework tool in accordance with the present invention;

DESCRIPTION OF THE PREFERRED EMBODIMENTS

Figure 4A:
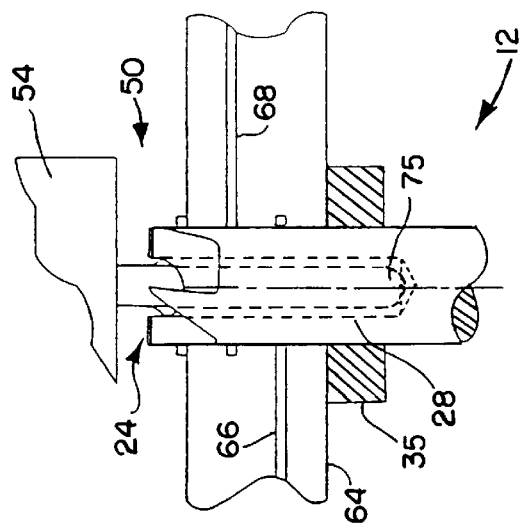
FIGS. 4A, 4B and 4C are partial cross-sectional views illustrating in sequence the manner in which the printed wiring assembly rework tool mills an annular slot around a component pin in accordance with the present invention.

The present invention will now be described with reference to the drawings wherein like reference numerals are used to refer to like elements throughout.

Referring initially to FIG. 1, a printed wiring assembly rework tool apparatus 10 is shown in accordance with the present invention. The apparatus 10 includes a rework tool 12 which is secured in a chuck 14 extending from a motor housing 16. A motor 18 (shown in phantom) within the housing 16 drives the chuck 14 so as to rotate the rework tool 12 about its axis 20.

The rework tool 12 includes a shank 22 having a cutting face 24 at an end thereof. As is shown more clearly in FIGS. 2 and 3, the cutting face 24 includes a plurality of cutting teeth 26 extending radially outward relative to the rotational axis 20. The cutting teeth 26 are preferably equally spaced about a circumference of a pilot hole 28 included at the cutting face 24 in the end of the shank 22. The pilot hole 28 is aligned coaxially with the rotational axis 20 as shown in FIG. 3. As is discussed more fully below in relation to FIGS. 4A–4C, the pilot hole 28 serves to receive a component pin in a printed wiring assembly as the cutting teeth 26 cut or otherwise mill an annular slot around the pin. The width of the slot is determined by the radius Ro of the cutting face 24 less the radius Rp of the pilot hole 28 as will be appreciated. The slot formed around the pin serves to sever one or more electrical connections provided to the component pin as described below with reference to FIGS. 4A–4C and 5A–5C.

Referring specifically now to FIG. 2, a length Lp of the pilot hole 28 preferably is sufficiently long to accommodate the entire length of a component pin to be reworked as discussed below. A diameter Dp of the pilot hole 28 is preferably slightly larger than the diameter of the component pin to be reworked. A diameter Do of the cutting face 24 is relatively small to enable the rework tool 12 to be utilized with printed wiring assemblies having high pin count components with closely spaced component pins. Exemplary dimensions for the rework tool 12 are as follows, although different dimensions are certainly within the scope of the invention:

- cutting face diameter: Do=0.080 inch
- pilot hole diameter Dp=0.030 inch
- pilot hole length Lp=0.150 inch
- length of shank (FIG. 1) Ls=approx. 3.0 inches The diameter of the shank 22 preferably is the same as the diameter Do of the cutting face 24 for at least the length of the pilot hole 28 as shown in FIG. 2. However, the diameter of the shank 22 may be increased beyond this point for added structural support. In the exemplary embodiment, the rework tool 12 is made of tool steel.

Referring back to FIG. 1, the end of the shank 22 opposite the cutting face 24 is secured in the chuck 14 via a set screw 30 or other means. The motor 18 preferably is an electric motor controlled by an on/off switch 32. The housing 16 preferably is in the shape of a handle which allows a user to grip and support the tool apparatus 10 in one hand similar to a small drill.

The rework tool 12 may include an adjustable stop collar 35 as shown in FIG. 1. As is discussed below in relation to FIGS. 4A–4C, the stop collar 35 is positioned on the shank 22 so as to control the depth which the cutting face 24 extends into a printed wiring board. The position of the stop collar 35 along the shank 22 is adjusted and fixed via a set screw 37.

Figure 4B:
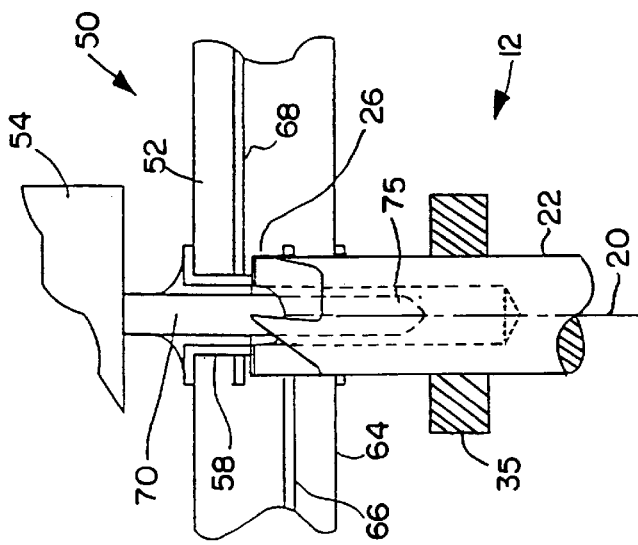
Figure 4C:
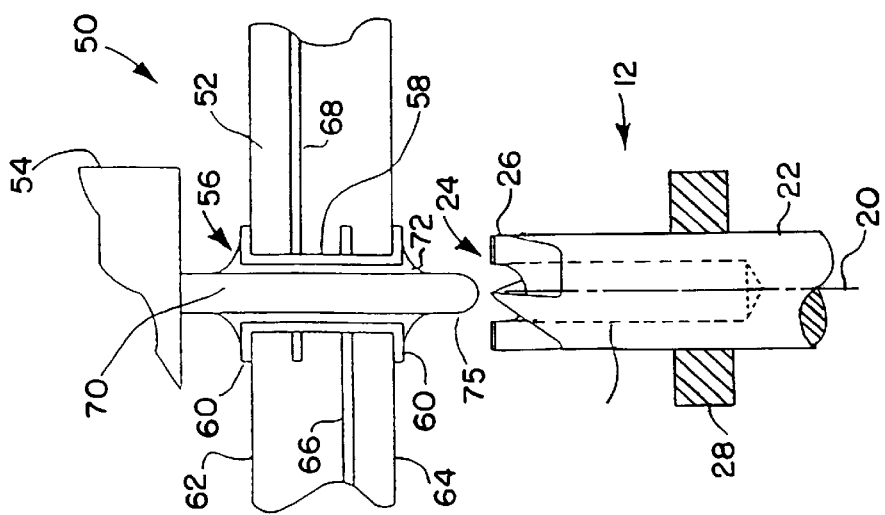

Referring now to FIGS. 4A–4C, and initially to FIG. 4A, the process of using the apparatus 10 of FIG. 1 to rework a printed wiring assembly will be described. FIG. 4A shows a portion of a printed wiring assembly 50. The printed wiring assembly 50 includes a printed wiring board 52 with an electrical component 54 such as an integrated circuit assembled thereon. The printed wiring board 52 in the exemplary embodiment is a multi-layer board and includes a plated through hole 56. The plated through hole 56 includes a barrel 58 representing the conductive surface of the plated through hole. A plated through hole pad 60 is formed at each end of the barrel 58 on a top surface 62 and bottom surface 64 of the printed wiring board 52. A first printed circuit trace 66 and a second printed circuit trace 68 are formed on respective layers and are both electrically connected to the printed through hole 56 via a connection to the barrel 58.

The component 54 includes a pin 70 which protrudes through the printed wiring board 52 from the top surface 62 to the bottom surface 64. Typically, the component pin 70 will extend beyond the bottom surface 64 as shown. The component pin 70 is soldered to the plated through hole 56 via solder 72 which typically fills any voids between the component pin 70 and the exposed surface of the plated through hole barrel 58. As a result, a reliable electrical connection is formed between the component pin 70 and the circuit traces 66 and 68.

In the course of developing the printed wiring assembly 50, it may become necessary to isolate electrically the component pin 70 from either printed circuit trace 66 or printed circuit traces 66 and 68. The need for such reworking may be due to a design change, a mistake in the original layout, etc. In order to perform such reworking, it is preferred that initially any excess solder 72 surrounding the component pin 70 be removed using a solder wick or vacuum based desoldering tool, for example. The step of removing the excess solder 70 facilitates the cutting operation as will be appreciated. However, such step is by no means necessary to the invention. Significantly, any other pins associated with the component 54 may remain soldered in place.

Next, as shown in FIG. 4A, the rework tool 12 is positioned adjacent to where the component pin 70 extends beyond the bottom surface 64. The cutting face 24 is positioned generally parallel the bottom surface 64, and the rework tool 12 is aligned with the component pin 70 such that the end 75 of the component pin 70 is received by the pilot hole 28 at the cutting face 26. The cutting face 26 is then pressed into engagement with the bottom surface 64 as the rework tool 12 is rotated about the axis 20 via the motor 18 (FIG. 1). As a result, the cutting teeth 26 begin to mill an annular slot (80 in FIG. 5B) around the component pin 70 and into the printed wiring board 52 as shown in FIG. 4B. As the cutting face 26 penetrates the printed wiring board 52, the plated through hole barrel 58 is milled away. Depending on the depth of penetration, the electrical connection between the first printed circuit trace 66 and the component pin 70 can be severed as shown in FIG. 4B. If the operation is continued, the depth of the annular slot formed by the cutting teeth 26 will extend up through the point where the second printed circuit trace 68 connects to the plated through hole barrel 58. As a result, the electrical connection between the component pin 70 and the second printed circuit trace 68 will be severed as shown in FIG. 4C. All during such time, the component pin 70 is accommodated by the pilot hole 28 so as to eliminate the need to remove the component 54 from the printed wiring assembly. At the same time, the combination of the pilot hole 28 and the pin 70 helps to align the rework tool 12 throughout the cutting operation.

In the event it is desirable to isolate completely the component pin 70 from the printed wiring board 52, the rework tool 12 can be used to cut an annular slot completely through the printed wiring board 52 as shown in FIG. 4C. In the embodiment of FIGS. 4A–4C, the stop collar 35 is adjusted on the shank 22 to a position which will permit the cutting face 24 to cut through the entire printed wiring board 52. Thereafter, the stop collar 35 engages the bottom surface 64 of the printed wiring board 52 so as to prevent the cutting face 24 from proceeding further and possibly damaging the component 54. In an alternate embodiment, however, the position of the stop collar 35 along the shank 22 may be adjusted so as to allow the cutting face 24 to penetrate only so far as to sever the connection between the component pin 70 and the first printed circuit trace 66 (e.g., the extent shown in FIG. 4B). Alternatively, the stop collar 35 may be adjusted to permit the cutting face 24 to penetrate deep enough to sever the electrical connections between the component pin 70 and both the first and second printed circuit traces 66 and 68, yet not so deep as to cut completely through the printed wiring board 52. Thus, it will be appreciated that the position of the stop collar 35 will depend largely on the desired cutting depth which, in turn, is dependent upon the maximum depth of the electrical connections which are to be severed.

Figure 5C:
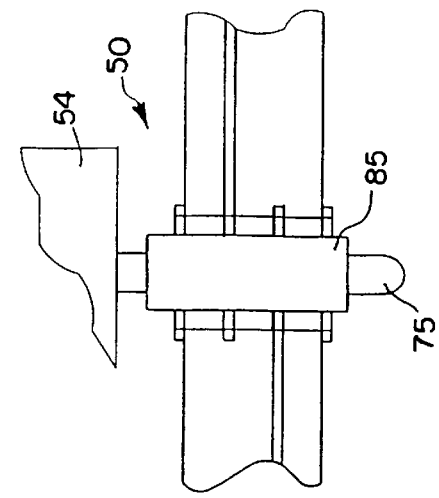
FIG. 5C is a partial cross-sectional view of the component pin of FIG. 5B with a sleeve thereon for further isolating the component pin from the printed wiring board in accordance with the present invention.
Figure 5B:
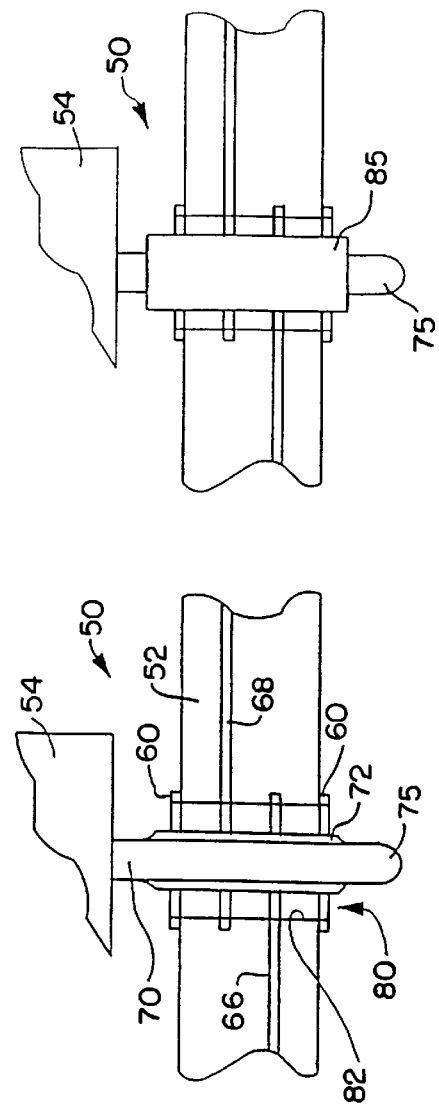
FIG. 5B is a cross-sectional view of the component pin of FIG. 5A after using the printing wiring assembly rework tool to completely isolate the component pin from the printed wiring board in accordance with the present invention.
Figure 5A:
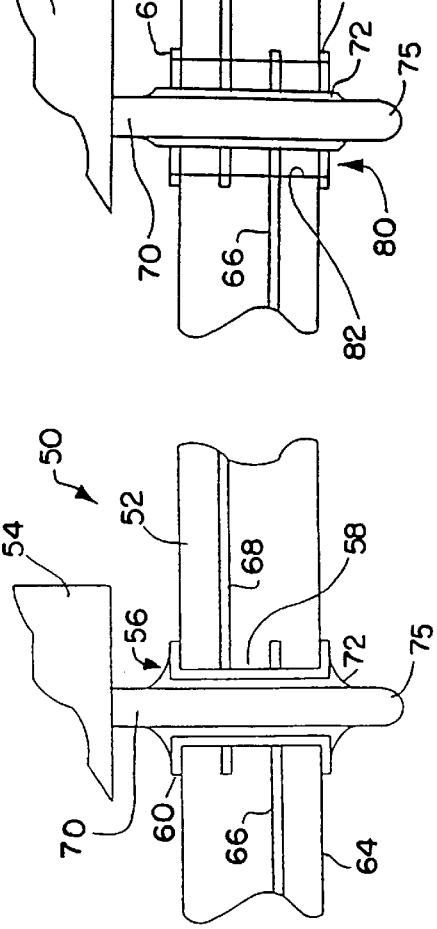
FIG. 5A is a cross-sectional view of a component pin extending S through the printed wiring board prior to reworking.

FIG. 5A represents a printed wiring assembly 50 as described above prior to being reworked using the rework tool 12. FIG. 5B represents the printed wiring assembly 50 after the rework tool 12 has been used to cut an annular slot 80 completely through the printed wiring board 52 (as represented in FIG. 4C). As is shown in FIG. 5B, only a remnant of the plated through hole pad 60 remains. The plated through hole barrel 58 has been completely removed during the cutting process. The component pin 70 is completely isolated from both printed circuit traces 66 and 68. Some solder remnants 72 may remain on the component pin 70 due to a difference in diameter between the pin 70 and the pilot hole 28. However, there still exists sufficient space between the component pin 70 and an outer surface 82 of the annular slot 80 to provide electrical isolation therebetween.

FIG. 5C illustrates an alternate embodiment of the invention whereby an isolation sleeve 85 is placed on the component pin 70 after reworking the pin using the rework tool 12. The isolation sleeve 85 fits within the void created by the rework tool 12 and is made of an electrically non-conductive material such as plastic. The isolation sleeve 85 may be placed on the exposed component pin 70 to assure electrical isolation even in the event the pin 70 is accidentally bent, for example, so as to otherwise come in contact with one of the severed printed circuit traces.

Figure 6:
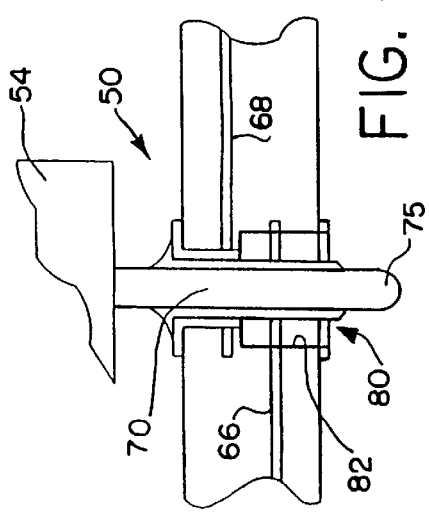
FIG. 6 is a cross-sectional view of the component pin of FIG. 5A after using the printed wiring assembly rework tool to mill an annular slot only partially through the printed wiring board in accordance with the present invention.

FIG. 6 represents the reworked printed wiring assembly 50 in the case where the rework tool 12 has been used to cut an annular slot 80 only partially through the printed wiring board 52 (as represented in FIG. 4B). As shown in FIG. 6, the electrical connection between the pin 70 and the printed circuit trace 66 has been severed whereas the connection between the pin 70 and the printed circuit trace 68 has not. Although not shown, an isolation sleeve 85 having a length approximately equal to the depth of the slot 80 could be positioned on the pin 70 to fill the void created by the rework tool 12 and to further ensure isolation.

Figure 7:
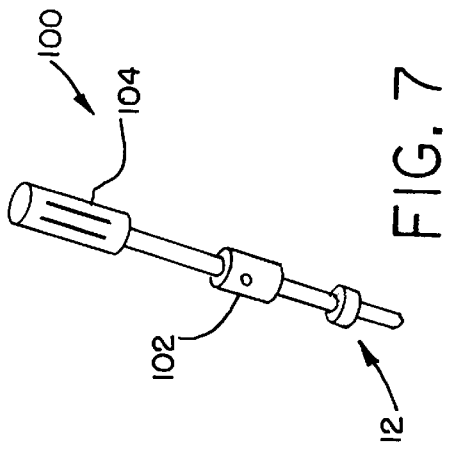
FIG. 7 is a perspective view of another embodiment of a printed wiring assembly rework tool apparatus in accordance with the present invention.

Referring briefly to FIG. 7, a manual printed wiring assembly rework tool apparatus 100 is shown. The rework tool apparatus 100 includes a rework tool 12 similar to that described above, but in this embodiment the rework tool 12 is held within a chuck 102 which is rotated by hand. For example, rotary motion imparted by a user-on a handle 104 causes the chuck 102 to rotate the rework tool 12 about its rotational axis 20 similar to a screwdriver action.

In view of the above description, it will be appreciated that the present invention is useful in reducing the cost and time associated with reworking a printed wiring assembly. The rework tool according to the invention makes it possible to rework component pins without having to remove the components from the printed wiring board. The invention can be used with virtually any type printed wiring board material including organic matrix type materials such as epoxy/glass, polyimide/glass, Kevlar/epoxy, etc. The embodiment of the rework tool as described herein includes four cutting teeth. However, it will be appreciated that a number of teeth other than four is certainly within the scope of the invention. Although the invention was described by way of example in connection with a multi-layer printed wiring board, it will be appreciated that the invention also has application with single-sided and/or double-sided boards. The particular dimensions of the rework tool can be tailored to most pin sizes and printed wiring board thicknesses as will be appreciated based on the disclosure herein.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A tool for reworking a printed wiring assembly having a pin protruding through a printed wiring board, the tool comprising:

a shank rotatable about an axis;

a pilot hole, having a diameter slightly larger than a diameter of the pin, in an end face of the shank and centered about the axis for receiving the pin; and cutting teeth on the end face of the shank for milling an annular slot around the pin in the printed wiring board as the shank is rotated about the axis and the pin is received by the pilot hole.

2. A tool according to claim 1, wherein the cutting teeth extend radially outward relative to the axis.

3. A tool according to claim 1, further comprising a stop collar located on the shank for establishing a maximum depth which the cutting teeth on the end face can penetrate the printed wiring board.

4. A tool according to claim 3, wherein the stop collar is adjustable along a length of the shank to adjust the maximum depth.

5. A tool according to claim 1, wherein the cutting teeth comprise at least four teeth.

6. A tool apparatus for reworking a printed wiring assembly having a pin protruding through a printed wiring board, the tool apparatus comprising:

a shank rotatable about an axis;

means for rotating the shank;

a pilot hole, having a diameter slightly larger than a diameter of the pin, in an end face of the shank and centered about the axis for receiving the pin; and cutting teeth on the end face of the shank for milling an annular slot around the pin in the printed wiring board as the shank is rotated about the axis and the pin is received by the pilot hole.

7. A tool apparatus according to claim 6, wherein the cutting teeth extend radially outward relative to the axis.

8. A tool apparatus according to claim 6, further comprising a stop collar located on the shank for establishing a maximum depth which the cutting teeth on the end face can penetrate the printed wiring board.

9. A tool apparatus according to claim 8, wherein the stop collar is adjustable along a length of the shank to adjust the maximum depth.

10. A tool apparatus according to claim 6, wherein the means for rotating comprises a motor.

11. A tool apparatus according to claim 10, wherein the motor is an electric motor.

12. A tool apparatus according to claim 6, wherein the means for rotating comprises a hand-driven chuck.

13. A printed wiring assembly reworking system, comprising:

a printed wiring assembly having at least one pin protruding through a printed wiring board; and a tool for reworking the printed wiring assembly, the tool including:

a shank rotatable about an axis;

a pilot hole, having a diameter slightly larger than a diameter of the pin, in an end face of the shank and centered about the axis for receiving the pin; and cutting teeth on the end face of the shank for milling an annular slot around the pin in the printed wiring board as the shank is rotated about the axis and the pin is received by the pilot hole.

* * * * *